United States Patent [19]
Mori et al.

[11] Patent Number: 5,241,696
[45] Date of Patent: Aug. 31, 1993

[54] TUNER WITH SELECTIVE EQUALIZATION OF DIFFERENT PROGRAM SOURCES

[75] Inventors: Shuichi Mori; Hisashi Kihara; Junichi Fuse; Takashi Miyake; Yoshikatsu Ikata; Nobuo Utsugi, all of Kawagoe, Japan

[73] Assignee: Pioneer Electronic Corporation, Tokyo, Japan

[21] Appl. No.: 852,933

[22] Filed: Mar. 13, 1992

Related U.S. Application Data

[63] Continuation of Ser. No. 489,671, Mar. 7, 1990, abandoned.

[30] Foreign Application Priority Data

Mar. 10, 1989 [JP] Japan .................................. 1-59321
Mar. 10, 1989 [JP] Japan .................................. 1-59322

[51] Int. Cl.⁵ ............................................. H04B 1/06
[52] U.S. Cl. ............................. 455/186.2; 455/200.1; 455/233.1; 455/267; 381/101; 381/103
[58] Field of Search ................... 455/43, 154.1, 154.2, 455/186.1, 186.2, 200.1, 233.1, 267; 381/101, 103; 333/28 R, 28 T

[56] References Cited

U.S. PATENT DOCUMENTS

| | | | |
|---|---|---|---|
| 4,046,960 | 9/1977 | Veale | 381/103 |
| 4,285,065 | 8/1981 | Priniski | 455/233 |
| 4,405,836 | 9/1983 | Meyerhoff | 455/233 |
| 4,461,026 | 7/1984 | Priniski | 455/233 |

FOREIGN PATENT DOCUMENTS

| | | | |
|---|---|---|---|
| 0119791 | 9/1984 | European Pat. Off. | |
| 0127613 | 5/1988 | Japan | 455/186.1 |
| 0079506 | 3/1990 | Japan | 381/103 |

*Primary Examiner*—Reinhard J. Eisenzopf
*Assistant Examiner*—Andrew Faile
*Attorney, Agent, or Firm*—Perman & Green

[57] ABSTRACT

Tuner for receiving a plurality of receiving frequencies and audio system having a plurality of audio components, characterized by the provision of a device for generating a designation command for selectively designating a program source such as a broadcast station at the receiving frequency of the tuner or an audio component, and an equalizer for adjusting the audio signal from the selected program source to have a frequency characteristic according to the program source designated by the designation command. By this provision, the need of operating tone controls at each time of the change of program source is obviated, so that the readiness of operation is improved.

2 Claims, 7 Drawing Sheets

| | PRE-SET CHANNEL | | | | | |
|---|---|---|---|---|---|---|
| | 1ch | 2ch | 3ch | 4ch | 5ch | 6ch |
| FREQUENCY DATA STORING AREA | $f_1$ | $f_2$ | $f_3$ | $f_4$ | $f_5$ | $f_6$ |
| | $C_1$ | $C_2$ | $C_3$ | $C_4$ | $C_5$ | $C_6$ |

FREQUENCY CHARACTERISTIC DATA STORING AREA

TUNER WITH SELECTIVE EQUALIZATION OF DIFFERENT PROGRAM SOURCES

This is a continuation of copending application Ser. No. 07/489,671 filed on Mar. 7, 1990 abandoned.

BACKGROUND OF THE INVENTION

1. Field of the Invention

The present invention relates to tuners receiving a plurality of broadcasting stations, and also to audio systems reproducing signals from a plurality of program sources such as tape-deck, tuner, etc.

2. Description of Background Information

There are broadcast stations in which pre-emphasis of a particular frequency range, a low frequency boost for example, is effected to the audio signal to be transmitted. In receiving and demodulating the broadcast wave from one of such stations by means of a tuner, it is necessary to adjust tone controls in order to obtain a flat frequency response. In the case of audio systems including components such as a tape-deck, a tuner, etc., the output signal level and frequency response can deviate among the components. With conventional audio systems in which the audio signal from a component is amplified in an amplifier to drive speaker systems, it is sometimes necessary to adjust the volume and tone controls in order to obtain a flat frequency response and the same signal level.

Therefore, manual operations for setting the frequency response are required, in the case of tuners, every time the receiving station is changed if broadcasting stations have different transmission characteristics of the audio signal, and in the case of audio systems, every time the selection of the component is changed. The requirement of such manual operations has been causing inconveniences in the operation of tuners or audio systems.

OBJECT AND SUMMARY OF THE INVENTION

An objective of the present invention is to provide a tuner which is easy to operate even if each broadcasting station has a different audio signal transmission characteristic.

Another objective of the present invention is to provide an audio system which is easy to operate even if the output signal level and frequency response characteristic are different for each component.

According to the present invention there is provided a tuner for receiving a plurality of broadcast waves, comprising, means for storing a plurality of frequency data corresponding to frequencies to be received, means for generating a designation command for selectively designating one of the plurality of frequency data, reading means for reading-out frequency data designated by the designation command, means for receiving a high-frequency signal having a frequency corresponding to the frequency data read-out by the reading means, demodulating means for demodulating the high-frequency signal to generate an audio signal, and equalizing means for adjusting the audio signal to have a frequency characteristic according to the designation command and in turn issuing the audio signal.

According to another aspect of the present invention, there is provided an audio system comprising, a plurality of audio components each generating an audio signal, means for generating a designation command for designating one of the plurality of audio components, relaying means for relaying the audio signal issued from one of audio components designated by the designation command, and equalizing means for adjusting the audio signal relayed by the relaying means to have a frequency characteristic according to the designation command and in turn issuing the audio signal.

DETAILED DESCRIPTION OF THE PREFERRED EMBODIMENTS

The preferred embodiment of the present invention will be described with reference to the accompanying drawings hereinafter.

Figure 1:
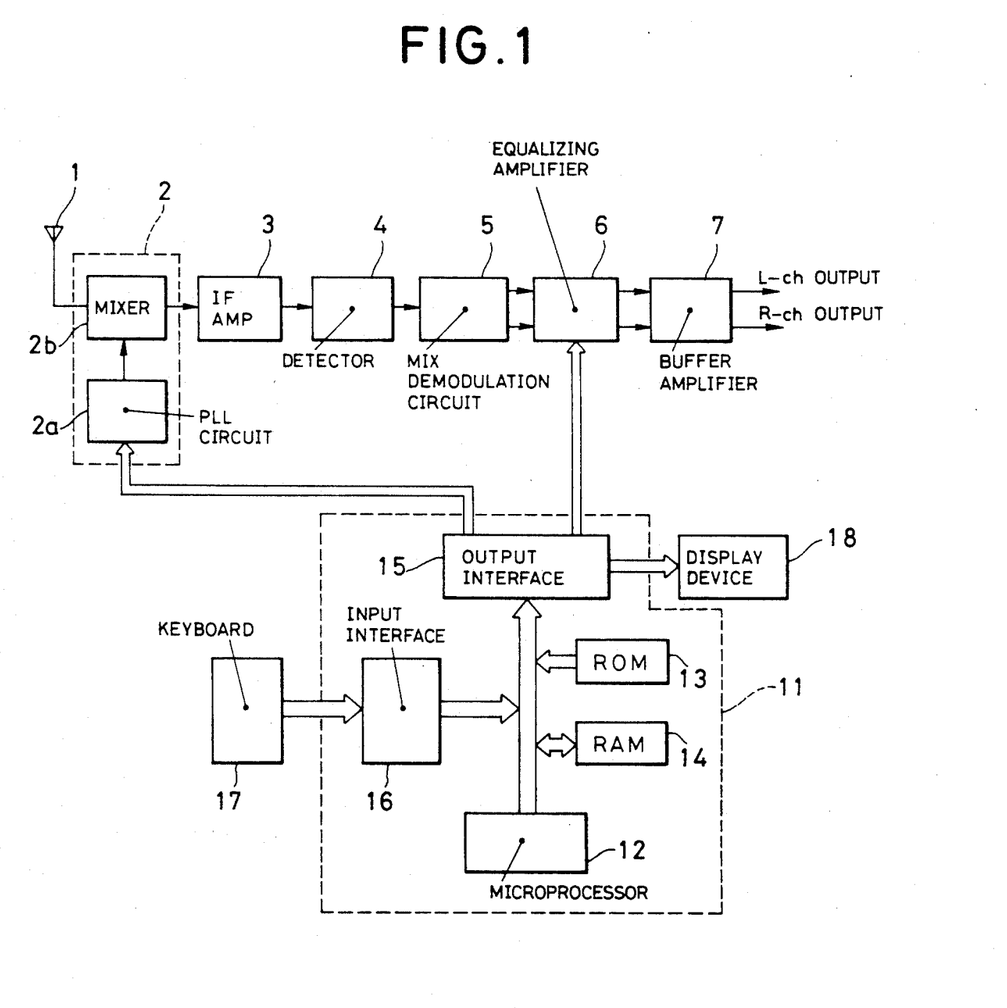
FIG. 1 is a block diagram showing an embodiment of the tuner according to the present invention.

FIG. 1 shows a tuner according to the present invention.

In this tuner, broadcast waves received at an antenna 1 are supplied to a front-end 2 in which the frequency of a desired station is selected and converted to an intermediate frequency (IF), and supplied to a detector 4 through an IF amplifier 3. The front-end 2 is configured that a local oscillation signal to a mixer 2b is generated by the PLL synthesizer system using a PLL circuit 2a including a programmable divider. With this structure, the tuning operation is performed by controlling the dividing ratio of the programmable frequency divider by means of a controller 11 which will be described later. The detection output signal of the detector 4 is supplied to a multiplex (MPX) demodulation circuit 5 to be separated into audio signals of the L (left) and R (right) channels in the case of a stereophonic broadcast, and supplied to an equalizing amplifier 6. The equalizing amplifier 6 is configured so that the frequency characteristics of the left and right channels are varied in response to a control signal from the controller 11. The equalizing amplifier 6 for example includes a plurality of band-pass filters having different center frequencies and level controllers such as VCAs (voltage controlled amplifiers) provided for the band-pass filters respectively. The output signal of the equalizing amplifier 6 is forwarded as a reproduced audio signal through a buffer amplifier 7. The buffer amplifier 7 has a flat frequency characteristic.

The controller 11 consists of a microcomputer which includes a microprocessor 12, a ROM 13, a RAM 14, an output interface 15, an input interface 16, and a clock generator (not shown). The microcomputer 13, ROM 13, RAM 14, output interface, and input interface are mutually connected by means of a bus. The RAM 14 consists of a non-volatile memory, otherwise the RAM 14 is powered by a back-up power supply so that the stored contents are maintained also when the power supply of the tuner is turned-off. A keyboard 17 and a dot-matrix type display device 18 are connected to the controller 11.

Figure 2:
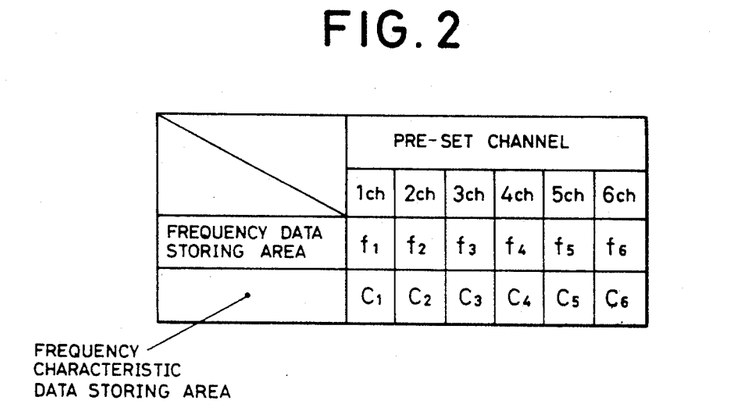
FIG. 2 is a diagram showing a data storing area formed in a RAM of the tuner shown in FIG. 1.

In the construction described above, a program for controlling the operation of the microprocessor and fixed data are stored in the ROM 13, and upon starting of the power supply the microprocessor 12 starts the operation in accordance with the program stored in the ROM 13. In the RAM 14, a frequency data storing area for storing frequency data $f_1$ through $f_6$ corresponding to receiving frequencies of 6 channels and a frequency characteristic data storing area for storing frequency characteristic data $c_1$ through $c_6$ for determining the frequency characteristic of the equalizing amplifier 6 for each channel are formed as shown in FIG. 2. The frequency characteristic data $c_1$ through $c_6$ are all set to the flat frequency characteristic at the time of initial setting.

The above-described frequency data are provided for determining the dividing ratio of the programmable divider in the PLL circuit 2a. When the frequency data is set in the programmable divider by means of the microprocessor 12, the tuner enters into a tuning state at a frequency corresponding to the frequency data set in the programmable divider.

The keyboard 17 includes various keys namely, frequency setting key for presetting the receiving frequency, characteristic setting key for presetting the frequency characteristic, level adjusting keys for adjusting the frequency characteristic provided for the frequency bands respectively, preset channel keys (1) through (6) for designating preset channels of which the preset receiving frequency and the frequency characteristic are stored as data and also for the tuning operation, a tuning key for arbitrarily varying the receiving frequency, etc. (all not illustrated). When one of these keys is operated, a digital code corresponding to the operated key is supplied to the microprocessor 12 through the input interface 16, so that the operated key is distinguished by the microprocessor 12.

The presetting of the above-mentioned frequency data and frequency characteristic data will be explained while following the operation of the microprocessor 12.

Figure 3A:
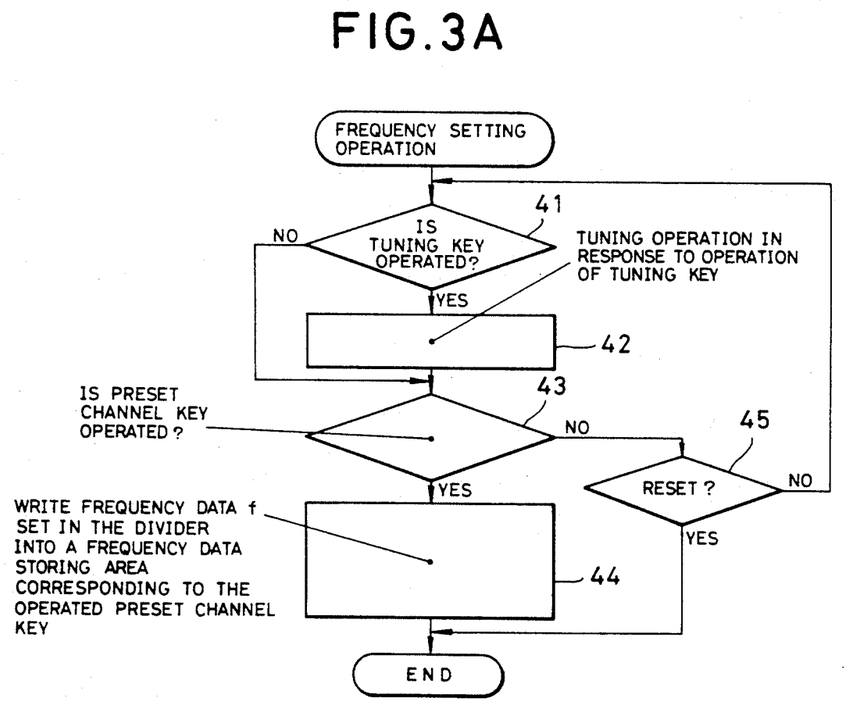
FIG. 3A through 3C are flowcharts showing the operation of a microprocessor in the tuner shown in FIG. 1.

When the frequency setting key is operated and the operation is detected by the microprocessor 12, it starts the following frequency setting operation. At first, the microprocessor 12 judges whether or not the tuning key is operated (step 41). If the tuning key is operated, the microprocessor 12 performs the tuning operation by varying the value of the receiving frequency data f set in the programmable divider in the PLL circuit 2a in response to the operation of the tuning key (step 42). If the tuning key is not operated, the microprocessor 12 judges whether or not any one of the preset channel keys (1) through (6) is operated (step 43). When one of the preset channel keys (1) through (6) is operated, the microprocessor 12 writes the frequency data f into a frequency data storing area for a channel corresponding to the operated preset channel key (step 44). If none of the preset channel keys (1) through (6) is operated, the microprocessor 12 judges whether or not the program is to be reset (step 45). If any one of keys other than the preset channel keys (1) through (6) and tuning key is operated, the microprocessor 12 judges that the program is to be reset, and stops the frequency setting operation.

Figure 3B:
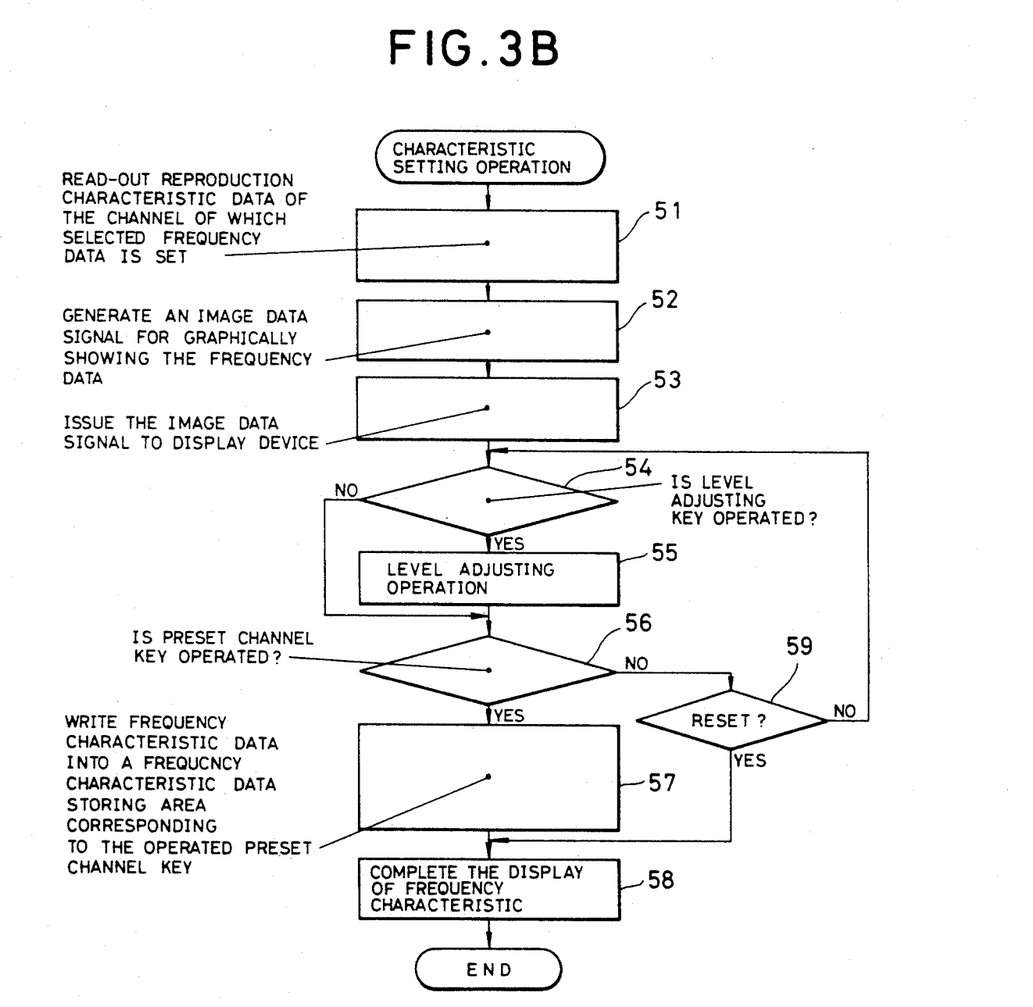

When the characteristic setting key is operated and the operation is detected by the microprocessor 12, it starts the following characteristic setting operation. As shown in FIG. 3B, the microprocessor 12 reads-out the frequency characteristic data of the preset channel to which the receiving frequency data is set (step 51). Then, the microprocessor 12 generates an image data signal for graphically showing the read-out frequency characteristic data (step 52), and supplies the image data signal to the display device 18 through the interface 15 (step 53). In this way, the frequency characteristic of the preset channel, to which the data f of the frequency being received is set, is displayed in the display device 18.

If the tuner is not in the state of preset reception, the microprocessor 12 generates an image data signal for graphically showing a flat frequency characteristic data, and issues the image data. Subsequently, the microprocessor 12 judges whether or not any one of the level adjusting keys is operated (step 54). If one of the level adjusting keys is operated, the microprocessor 12 starts a level adjusting operation (step 55). This level adjusting operation is performed in such a manner that the signal level of the frequency band of the operated level adjusting key, within the frequency characteristic which has been read-out as data in step 51, is varied in response to the key operation and the image data signal responsive to the change in the level is generated and forwarded. More specifically, the microprocessor 12 generates an image data signal indicating on/off data for each dot of the display device 18. Therefore, a frequency characteristic to which the level change is effected in response to the operation of the level adjusting keys is displayed in the display device 18. When none of the level adjusting keys is operated, or when the level adjusting operation has been completed, the microprocessor 12 judges whether or not any one of the preset channel keys (1) through (6) is operated (step 56). If one of the preset channel keys (1) through (6) is operated, the microprocessor 12 writes the frequency characteristic data which is displayed in the display device 18 into the frequency characteristic data storing area of a channel corresponding to the operated preset channel key (step 57), and stops the display of the frequency characteristic in the display device 18 (step 58). When none of the preset channel keys (1) through (6) is operated, the microprocessor 12 judges whether or not the program is to be reset (step 59). For instance, when any key other than the preset channel keys (1) through (6) and the level adjusting keys is operated, the microprocessor 12 judges that the program is to be reset, and the characteristic setting operation is completed.

Figure 3C:
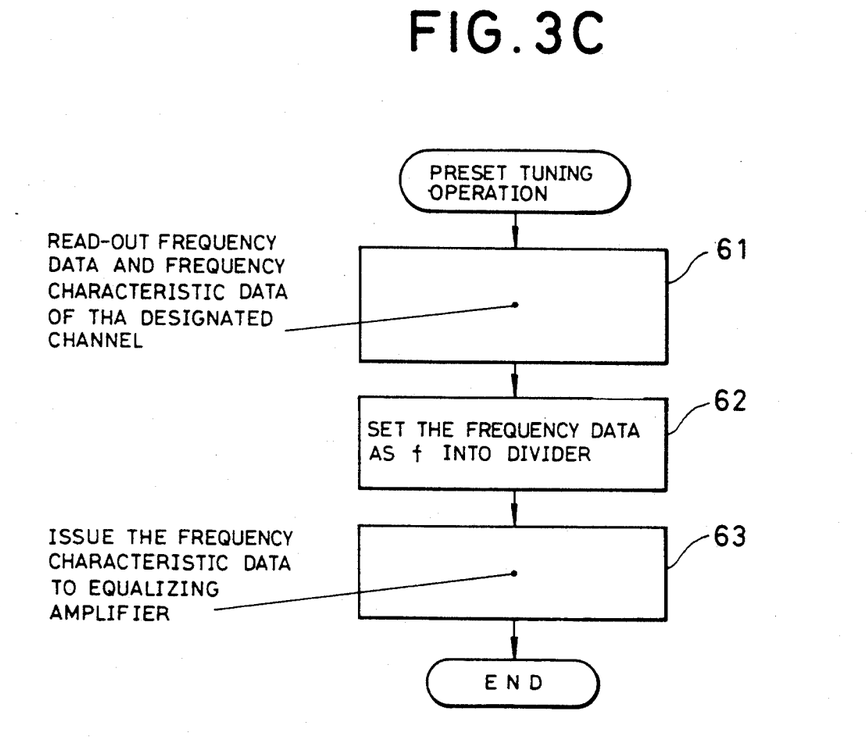

If any one of the preset channel keys is operated in a state in which the frequency data and frequency characteristic data are written into the respective storing areas, the microprocessor 12 starts the preset tuning operation. As shown in FIG. 3C, the microprocessor 12 reads-out the frequency data and frequency characteristic data respectively stored in the frequency data storing area and frequency characteristic data storing area of the channel designated by the operated preset channel key (step 61). Then, the microprocessor 12 sets the read-out frequency data into the programmable divider of the PLL circuit 2a (step 62), and supplies the read-out frequency characteristic data to the equalizing amplifier 6 through the interface 15 (step 63). Therefore, the tuner enters into the receiving state of the frequency corresponding to the frequency data set in the divider, and the equalizing amplifier 6 exhibits a frequency response corresponding to the supplied frequency characteristic data. With this frequency response, the equalizing amplifier 6 effects the correction to the audio signal issued from the MPX demodulation circuit 5, and issues a corrected audio signal. For example, if the preset channel key (2) is operated when the frequency data $f_2$ in the frequency data storing area of the preset channel 2 represents 81.3 MHz and the frequency characteristic data $c_2$ in the frequency characteristic data storing area of the same preset channel represents a frequency characteristic with a high frequency boost, the frequency data $f_2$ in the frequency data storing area and the frequency characteristic data $c_2$ in the frequency characteristic data storing area are read-out. Accordingly, the frequency data $f_2$ is set in the programmable divider as the receiving frequency data f, and the frequency characteristic data $c_2$ is supplied to the equalizing amplifier 6 so that the tuner receives the frequency of 81.3 MHz, and the reproduced audio signal is issued from the equalizing amplifier at the characteristic with a high frequency boosting.

As specifically described in the foregoing, the tuner according to the present invention is configured so that one of a plurality of stored frequency data is selected to be read-out in response to a designation command, a broadcast wave is received at a frequency corresponding to the read-out data, and the audio signal obtained from the received broadcast wave is adjusted by a frequency response corresponding to the designation command and issued subsequently. Therefore, even if the frequency characteristic of the audio signal of transmission is different for each broadcast station, the reproduction frequency characteristic of the audio signal as well as the receiving frequency can be varied simply by issuing a designation command for the tuning operation. Therefore, the need of adjusting the tone controls at each tuning operation is obviated and the readiness of operation is improved considerably.

Turning to FIGS. 4 through 6c of the accompanying drawings, the embodiment of the audio system according to the present invention will be described hereinafter. In this embodiment, the audio system includes a controller 11 which is the same as the controller 11 shown in FIG. 1, and the explanation thereof will not be repeated.

Figure 4:
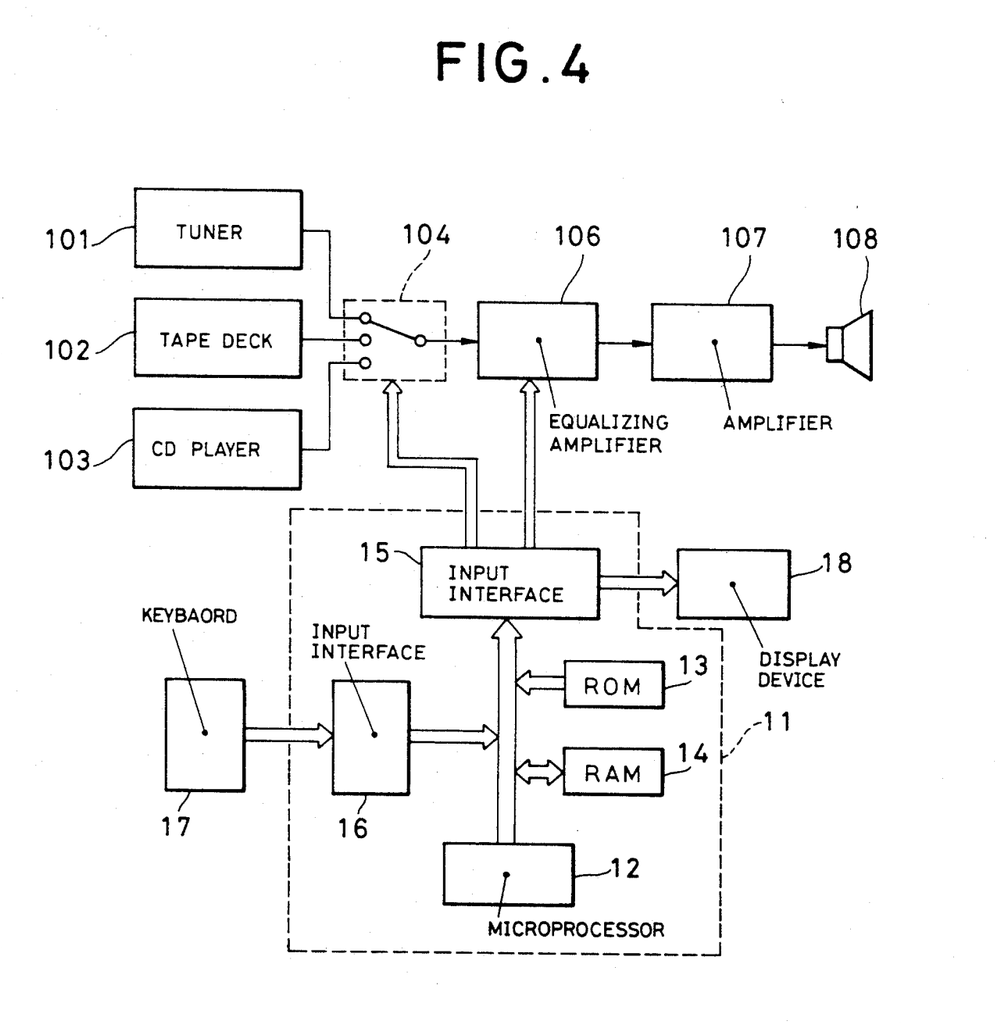
FIG. 4 is a block diagram showing an embodiment of the audio system according to the present invention.

The audio system includes a tuner 101, a tape deck 102, and a CD (compact disc) player 103 as audio component generating audio signals. The left and right audio signals issued from the tuner 101, tape deck 102, and the CD player 103 are supplied to a function switch 104, and alternatively supplied to an equalizing amplifier 106. In the figure, there is shown only one of the left and right channels for the purpose of simplicity. Like the equalizing amplifier 106 shown in FIG. 1, the equalizing amplifier 106 is configured so that the frequency characteristics of the left and right channels are varied in response to a control signal from the controller 11. The equalizing amplifier 106 for example includes a plurality of band-pass filters having different center frequencies and level controllers such as VCAs (voltage controlled amplifiers) provided for the band-pass filters respectively. The output signal of the equalizing amplifier 106 is amplified by the amplifier 107 to drive a speaker 108.

Figure 5:
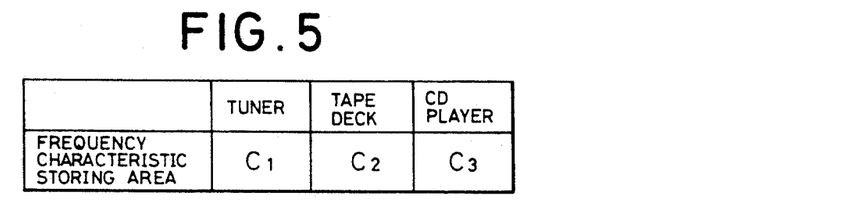
FIG. 5 is a diagram showing a data storing area formed in a RAM of the system shown in FIG. 4.

In the RAM 14 of the controller 11, there is formed a frequency characteristic data storing area for storing frequency characteristic data $c_1$ through $c_3$ for the audio components respectively, as shown in FIG. 5. The frequency characteristic data $c_1$ through $c_3$ are data for determining the frequency characteristic of the equalizing amplifier 106, and the data $c_1$ through $c_6$ are all set to the flat frequency characteristic at the time of initial setting.

The keyboard 17 includes various keys namely, function designation keys for designating the switch position of the function switch 4 described above (tape designation key, tuner designation key, and CD designation key), characteristic setting key for presetting the frequency characteristic, level adjusting keys for adjusting the frequency characteristic provided for the frequency bands respectively, etc. (all not illustrated). When one of these keys is operated, a digital code corresponding to the operated key is supplied to the microprocessor 12 through the input interface 16, so that the operated key is distinguished by the microprocessor 12.

The presetting of the above-mentioned frequency characteristic data will be explained while following the operation of the microprocessor 12.

Figure 6A:
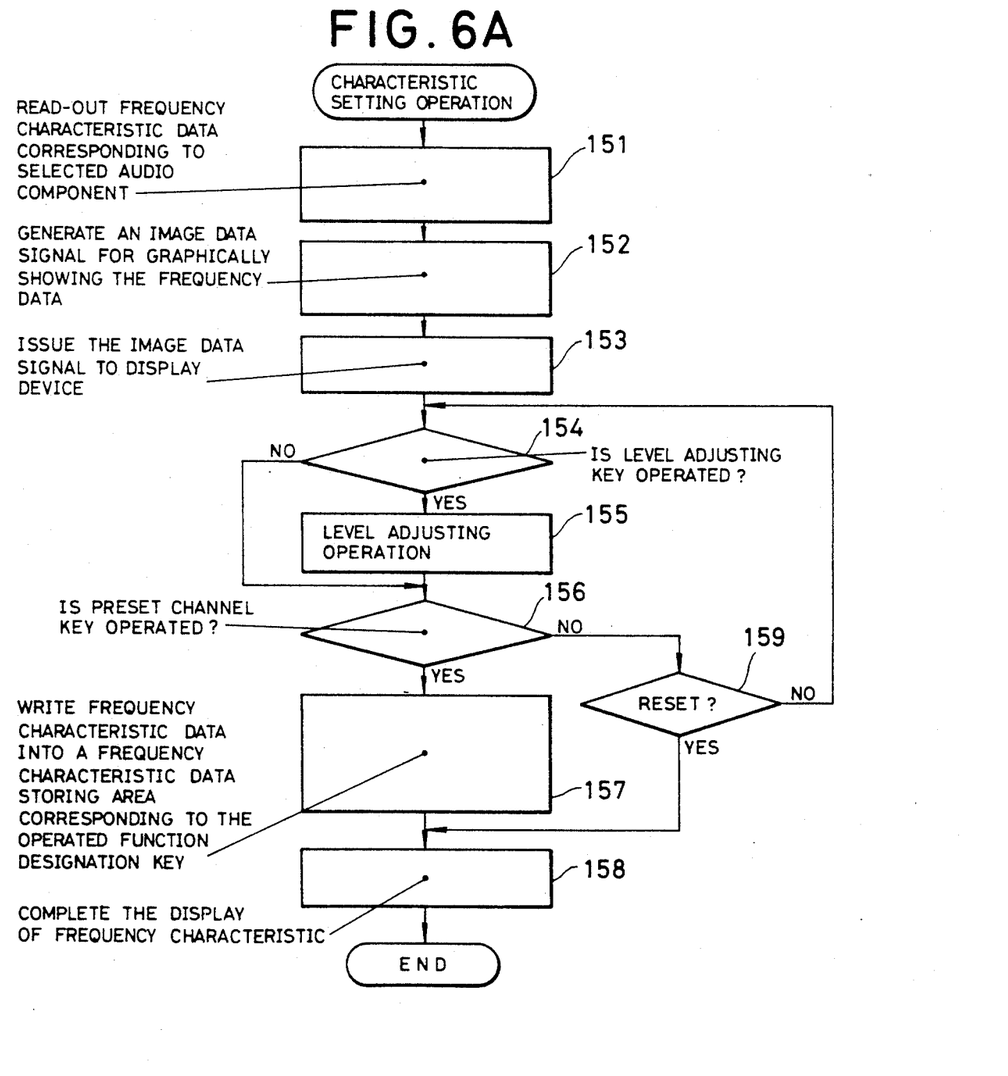
FIGS. 6A through 6B are flowcharts showing the operation of a microprocessor in the system shown in FIG. 4.

When the characteristic setting key is operated and the operation is detected by the microprocessor 12, it starts the following characteristic setting operation. As shown in FIG. 6A, the microprocessor 12 reads-out the frequency characteristic data of the audio component whose output is being selected by the function switch 104 (step 151). Specifically, when the tuner 101 is selected, the microprocessor reads-out the frequency characteristic data $c_1$. When the tape deck 102 is selected, the microprocessor 12 reads-out the frequency characteristic data $c_2$. Finally, when the CD player 103 is selected, the microprocessor 12 reads-out the frequency characteristic data $c_3$. Then, the microprocessor 12 generates an image data signal for graphically showing the read-out frequency characteristic data (step 152), and supplies the image data signal to the display device 18 through the interface 15 (step 153). In this way, the frequency characteristic corresponding to the audio component being selected is displayed in the display device 18.

In the case where no change is effected to the initial setting, the microprocessor 12 generates an image data signal for graphically showing a flat frequency characteristic data, and issues the image data. Subsequently, the microprocessor 12 judges whether or not any one of the level adjusting keys is operated (step 154). If one of the level adjusting keys is operated, the microprocessor 12 starts a level adjusting operation (step 155). This level adjusting operation is performed in such a manner that the signal level of the frequency band of the operated level adjusting key, within the frequency characteristic which has been read-out as data in step 151, is varied in response to the key operation and the image data signal responsive to the change in the level is generated and forwarded. More specifically, the microprocessor 12 generates an image data signal indicating on/off data for each dot of the display device 18. Therefore, a frequency characteristic to which the level change is effected in response to the operation of the level adjusting keys is displayed in the display device 18. When none of the level adjusting keys is operated, or when the level adjusting operation has been completed, the microprocessor 12 judges whether or not any one of the function designation keys is operated (step 156). If one of the function designation keys is operated, the microprocessor 12 writes the frequency characteristic data which is displayed in the display device 18 into the storing area corresponding to the operated function designation key (step 157), and stops the display of the frequency characteristic in the display device 18 (step 158). For instance, when the tape designation key is operated, the microprocessor 12 writes, as $c_1$, the frequency characteristic data being displayed in the display device 18. When none of the function designation keys is operated, the microprocessor 12 judges whether or not the program is to be reset (step 159). For instance, when any key other than the function designation keys and the level adjusting keys is operated, the microprocessor 12 judges that the program is to be reset, and the characteristic setting operation is completed.

Figure 6B:
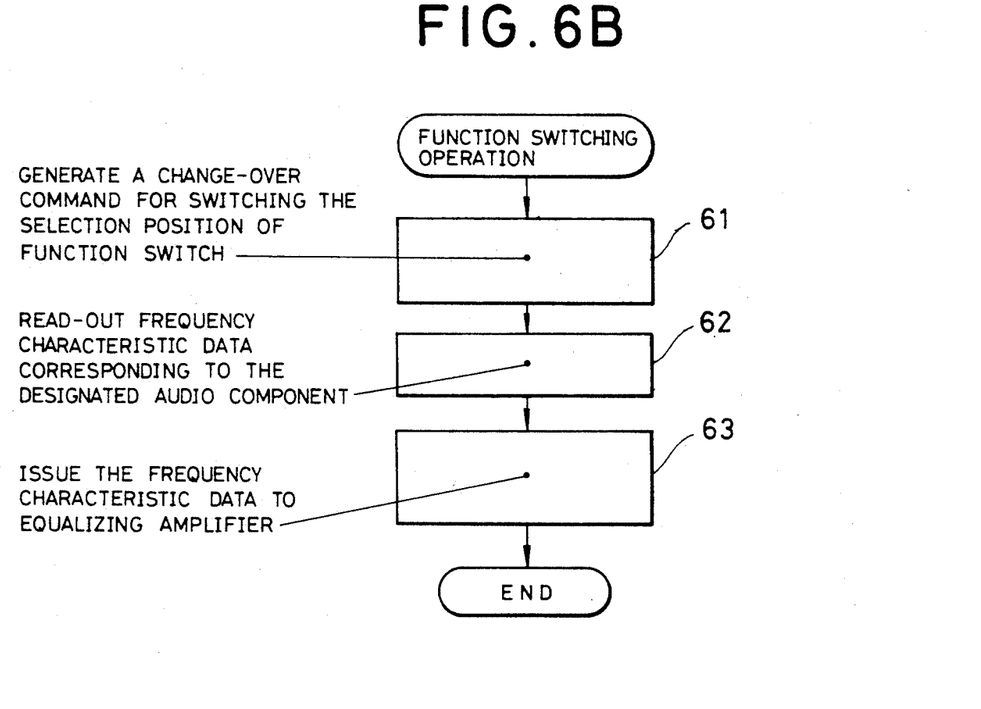

If any one of the function designation keys is operated in a state in which the frequency characteristic data are written into the respective storing areas, the microprocessor 12 starts the function switching operation. As shown in FIG. 6B, the microprocessor 12 supplies, to the function switch 104, a change-over command for relaying the audio signal from the audio component designated by the operated function designatio key (step 161), and reads-out the frequency characteristic data corresponding to the designated audio component (step 162). Then, the microprocessor 12 supplies the read-out frequency characteristic data to the equalizing amplifier 106 through the interface 15 (step 163). Therefore, the equalizing amplifier 106 exhibits a frequency response corresponding to the supplied frequency characteristic data. With this frequency response, the equalizing amplifier 106 effects the correction to the audio signal supplied through the function switch 104, and issues a corrected audio signal. For example, if the tape designation key is operated when the frequency characteristic data $c_2$ in the frequency characteristic data storing area represents a frequency characteristic with a high frequency boost, the function switch 104 is switched over to relay the audio signal from the tape deck 102. The frequency characteristic data $c_2$ in the frequency characteristic data storing area is read-out and supplied to the equalizing amplifier 106. As a result, the audio signal from the tape deck 102 is issued from the equalizing amplifier at the characteristic with a high frequency boosting and supplied to the amplifier 107 to drive the speaker 108.

In the embodiment described above, the speaker 108 and the amplifier 107 for driving the speaker 108 are included in the audio system. However, the present invention is applicable to such an audio system in which the audio signal from the equalizing amplifier 106 is forwarded as the output signal, and the speaker and driving amplifier are not integrated into the audio system. Furthermore, input terminals may be provided before function switch so that the connection between the function switch 104 and each audio component is made through the input terminals.

As specifically described in the foregoing, the audio system according to the present invention is configured so that the audio signal from one of a plurality of audio component is selectively relayed to the equalizing means in response to a designation command for selecting one of the audio components, and the audio signal is adjusted at the equalizing means by a frequency response corresponding to the designation command and issued subsequently. Therefore, even if the level and frequency characteristic of the audio signal are different for each of the audio components which may be in turn switched, the reproduction frequency characteristic of the audio signal from the selected audio component can be adjusted to a desired characteristic simply by the operation of selecting the audio component. Therefore, the need of manually operating the tone controls at each selection operation is obviated and the readiness of operation is improved considerably.

What is claimed is:

1. A tuner for receiving a plurality of broadcast wave frequencies, comprising:

means for storing a plurality of frequency values, each frequency value corresponding to a broadcast wave frequency to be received;

display means responsive to a user command for displaying an audio signal frequency characteristic corresponding to a broadcast wave frequency value;

adjustment means responsive to a user input for adjusting signal levels of frequency bands within said displayed audio signal frequency characteristics;

means for generating a designation command for selecting one of said frequency values;

reading means for reading-out a frequency value selected by said designation command;

means for receiving a broadcast wave frequency signal having a frequency corresponding to said read-out frequency value;

demodulating means for demodulating said broadcast wave frequency signal to generate an audio signal; and equalizing means responsive to said designation command, for adjusting said audio signal to have a frequency characteristic according to this selected frequency value, said equalizing means accessing an adjusted frequency characteristic corresponding to said selected frequency value and controlling in accordance therewith, a signal level of said audio signal in each of a plurality of frequency bands of said audio signal.

2. The tuner as claimed in claim 1, further comprising: means for storing each said adjusted audio frequency characteristic corresponding to each said broadcast wave frequency value, means for reading-out said adjusted audio frequency characteristic corresponding to a frequency value, when said frequency value is designated by said designation command, and wherein said equalizing means includes an equalizing amplifier for amplifying said audio signal with a frequency response corresponding to the read-out frequency characteristic.

* * * * *